(12) United States Patent
Lupashku et al.

(10) Patent No.: US 7,888,951 B2
(45) Date of Patent: Feb. 15, 2011

(54) INTEGRATED UNIT FOR ELECTRICAL/RELIABILITY TESTING WITH IMPROVED THERMAL CONTROL

(75) Inventors: Mirtcha Lupashku, Sunnyvale, CA (US); Jacob Herschmann, Palo Alto, CA (US); Gedaliahoo Krieger, Rehovot, IL (US)

(73) Assignee: QualiTau, Inc., Sunnyvale, CA (US)

( * ) Notice: Subject to any disclaimer, the term of this patent is extended or adjusted under 35 U.S.C. 154(b) by 85 days.

(21) Appl. No.: 12/368,933

(22) Filed: Feb. 10, 2009

(65) Prior Publication Data

US 2010/0201389 A1   Aug. 12, 2010

(51) Int. Cl.
*G01R 31/02* (2006.01)
(52) U.S. Cl. .................................. 324/750.03
(58) Field of Classification Search ........................ None
See application file for complete search history.

(56) References Cited

U.S. PATENT DOCUMENTS

| | | | |
|---|---|---|---|
| 6,097,200 A | 8/2000 | Turlapaty et al. | |
| 6,175,498 B1 * | 1/2001 | Conroy et al. | 324/765 |
| 6,288,371 B1 * | 9/2001 | Hamilton et al. | 219/530 |
| 6,288,561 B1 * | 9/2001 | Leedy | 324/760 |
| 6,791,171 B2 | 9/2004 | Mok et al. | |
| 7,247,035 B2 | 7/2007 | Mok et al. | |
| 7,349,223 B2 | 3/2008 | Haemer et al. | |
| 7,598,760 B1 * | 10/2009 | Bensing et al. | 324/755 |
| 7,659,738 B2 * | 2/2010 | Hong | 324/760 |
| 7,701,238 B2 * | 4/2010 | Wong et al. | 324/763 |
| 2002/0050833 A1 * | 5/2002 | Jones et al. | 324/760 |
| 2002/0118032 A1 * | 8/2002 | Norris et al. | 324/760 |
| 2004/0174181 A1 * | 9/2004 | Stone | 324/765 |
| 2006/0186909 A1 * | 8/2006 | Aube et al. | 324/760 |
| 2007/0030019 A1 * | 2/2007 | Kinsley | 324/760 |
| 2008/0174333 A1 * | 7/2008 | Hong | 324/765 |
| 2009/0002010 A1 * | 1/2009 | Wong et al. | 324/760 |
| 2009/0009204 A1 * | 1/2009 | Lee et al. | 324/760 |

OTHER PUBLICATIONS

International Search Report in corresponding PCT application No. PCT/US2010/022119, mailed Aug. 30, 2010.
Written Opinion in corresponding PCT application No. PCT/US2010/022119, mailed Aug. 30, 2010.

* cited by examiner

*Primary Examiner*—Jermele M Hollington
(74) *Attorney, Agent, or Firm*—Beyer Law Group LLP

(57) ABSTRACT

In accordance with an aspect, a thermally-controllable integrated unit is configured to hold devices under test. The integrated unit includes at least one heater board, comprised of a thermally-conductive material and provided with at least one global heater configured to globally heat the DUT board. A DUT board of the integrated unit includes a DUT board in thermal contact with the at least one heater board, the DUT board including a plurality of sockets, each socket configured to hold at least one DUT. The DUT has conductor paths to conduct electrical signals between test equipment and the terminals of DUTs in the sockets. Each socket includes an associated temperature sensor and a separately controllable local heater configured to, based on a temperature indication from the temperature sensor, heat a DUT in that socket.

20 Claims, 5 Drawing Sheets

BuffB
BHB

INTEGRATED UNIT FOR ELECTRICAL/RELIABILITY TESTING WITH IMPROVED THERMAL CONTROL

BACKGROUND

Semiconductor reliability testing requires accurate electrical stress and measurements under tight temperature control. Typical test temperatures range from slightly above room temperature to Tmax~350° C., while spatial temperature variations are often exacerbated by differences in self (Joule) heating from one Device Under Test (DUT) to another. Furthermore, DUT sockets, printed circuit boards (DUT boards), and insulation materials, easily available for temperatures below 250° C., are hard to make for higher temperatures.

Convection ovens, optimized for the required temperature range, have been used by the industry for many years. However, these ovens have two inherent shortcomings, which limit their performance: (i) the large volume associated with their heating mechanism (hot air convection) makes them impractical when a small number (5-15) of DUTs per temperature is needed; (ii) by definition, temperature control is global, so local temperature variations and non-uniformities are often problematic.

A different approach has led to a small oven unit, integrated with a single DUT board (prior art: U.S. Pat. No. 6,097,200), where the tested DUTs are maintained at a controlled temperature within the required range. The concept is based on an electrically heated surface, which transfers the heat via several metal plates to a radiator, positioned very closely to the DUTs. While the unit is compact and does not involve air convection, heating is global for the entire unit, with a single temperature sensor on the DUT board. Another limitation is the need to change the DUT board whenever the pin assignment of the packaged DUTs is changed.

SUMMARY

In accordance with an aspect, a thermally-controllable integrated unit is configured to hold devices under test. The integrated unit includes at least one heater board, comprised of a thermally-conductive material and provided with at least one global heater configured to globally heat the DUT board. A DUT board of the integrated unit includes a DUT board in thermal contact with the at least one heater board, the DUT board including a plurality of sockets, each socket configured to hold at least one DUT. The DUT has conductor paths to conduct electrical signals between test equipment and the terminals of DUTs in the sockets. Each socket includes an associated temperature sensor and a separately controllable local heater configured to, based on a temperature indication from the temperature sensor, heat a DUT in that socket.

DETAILED DESCRIPTION

The inventors have realized that a heating and integration technology, where specially designed heater boards, on which global and local electrical heaters are printed, can be integrated with a DUT board, so that the DUT sockets may be in direct physical contact with a local heater. In addition, a dedicated temperature sensor is physically integrated within each DUT socket. The result, in practice, is excellent temperature control at each and every DUT, regardless of spatial non-uniformities and differences in joule heating from one DUT to another. Finally, the unit may include an easily accessible printed circuit board outside the heated area, where the necessary bonding may be manually "programmed" by plug-in jumpers; making it suitable for a wide range of bonding configurations.

Figure 1:
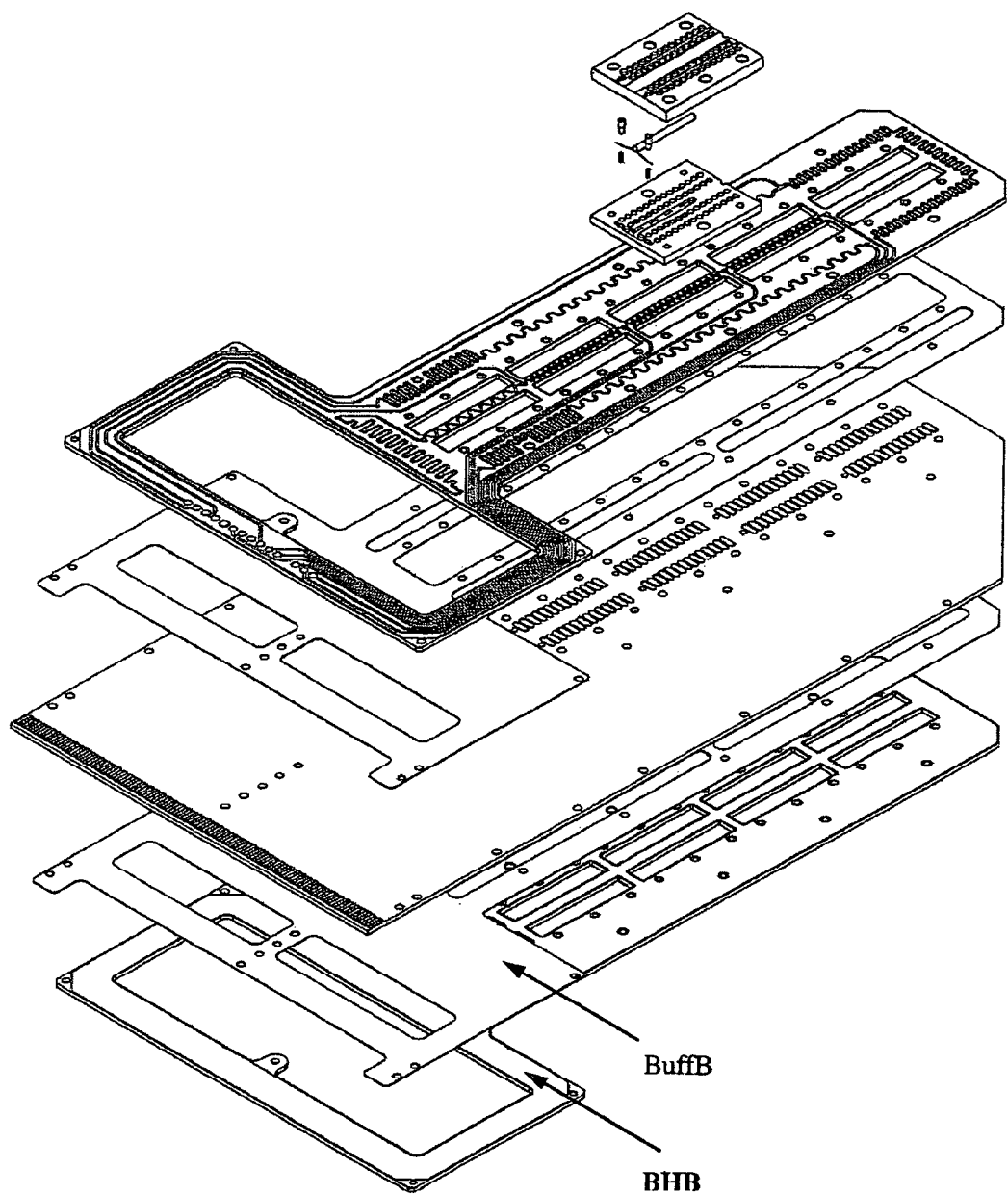
FIG. 1 is an exploded view of a DUT board assembly in accordance with an aspect.

Referring now to FIG. 1, in one aspect, a primary component referred to herein as "DUT Board Assembly", includes two identical Heater boards, two identical Buffer Boards, a DUT board, and sockets. A perspective and exploded view of an example of the DUT Board Assembly is shown in FIG. 1. Each Heater board (THB: Top Heater Board; and BHB: Bottom Heater Board) may be made of metal (such as stainless steel), with a thin dielectric film printed on it for insulation. Heating elements are located on top of the dielectric layer (such as by printing), while printed gold traces provide robust, low-resistance connectivity to the external stimuli, as well as interconnection among the heating elements, as necessary. The buffer boards may be made of electrically insulating, yet thermally conductive material (Mica, for example), and are located between the Heater boards and the DUT board, to avoid excessive mechanical stress on the printed layers of the DUT board. These Buffer boards, in one example, have no functional purpose per-se, and therefore are shown in FIG. 1 for reference only. The following description is based on FIG. 2, which is similar to FIG. 1 but without the Buffer boards. In the illustrated embodiment, the assembly is "two-sided"; namely, having DUTs on both sides of the DUT board.

Figure 2:
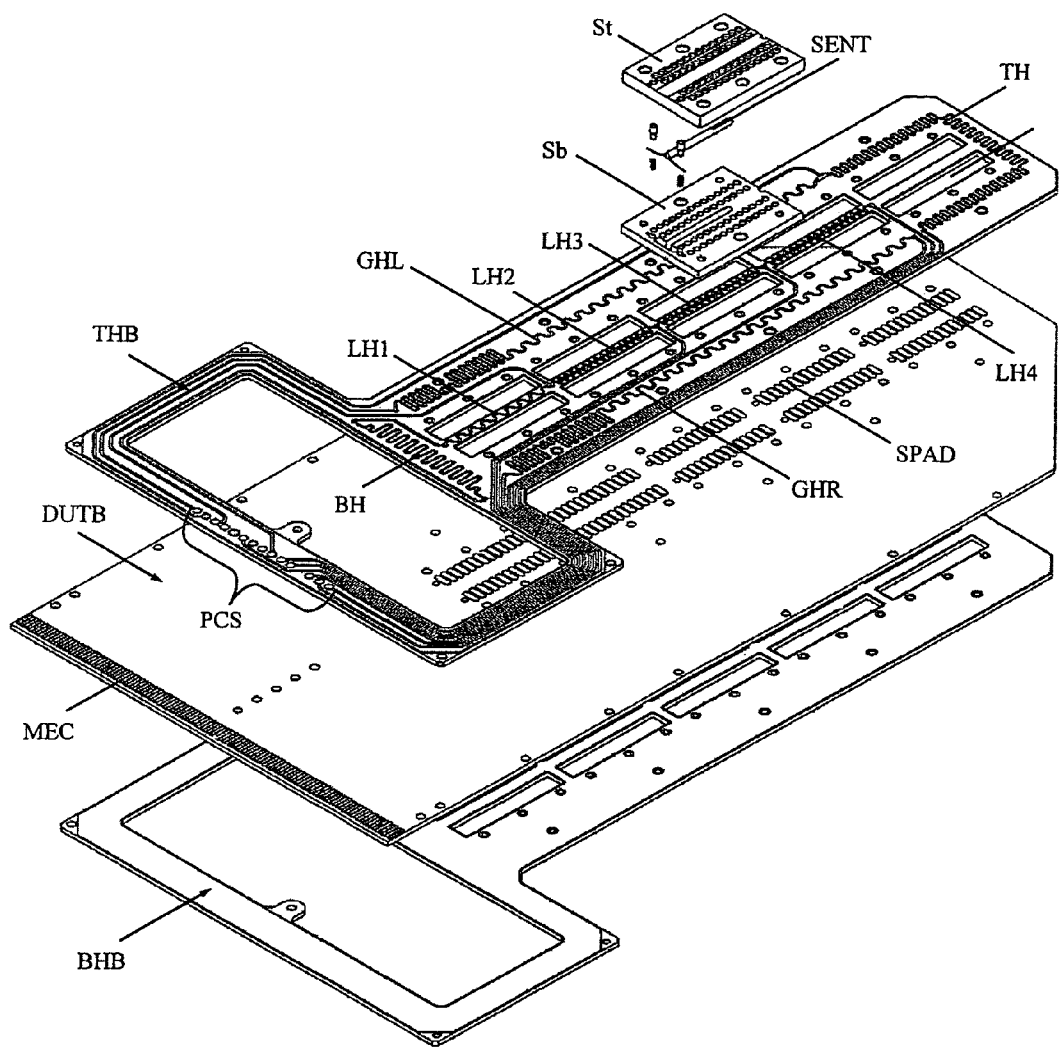
FIG. 2 is an exploded view of a DUT board assembly, without buffer boards.

Referring now to FIG. 2, THB (Top Heater Board) is mechanically attached to the "top" of the DUT board DUTB, while BHB (Bottom Heater Board) is mechanically attached to the "bottom" of the DUT board. Relative to FIG. 2, the terms "top" and "bottom" are arbitrary, because there is no top or bottom per-se; only two sides with a symmetric structure and layout. In FIG. 2, each Heater board has eight heating elements in total, but the number can change from one specific embodiment to another, as necessary. Four heating elements, LH1, LH2, LH3, and LH4 are "local"; namely, each local heating element is located underneath a single socket. The global heating elements, GHL and GHR are positioned at the left and right sides of the Heater board, respectively, and as such they heat the entire DUT board rather than one specific socket. The two remaining elements, BH and TH, are positioned at the bottom and at the top of the heater board, respectively. These heaters control the local temperature of the top and bottom socket, and also compensate for heat losses at the top and bottom edges. Note that every one of the heating elements can be independently activated to an appropriate level or turned off, without affecting the state of the others. In one example, the independent control of the heating elements is accomplished using spring-loaded pegs ("pogo pins") to deliver the electrical stimuli via gold plated pads (PCS in FIG. 2).

Generally, most of the heat may be delivered by the global heaters, with the local heaters being used primarily to fine tune the DUT temperature. The strong thermal coupling between the global heaters and the DUT board, as well as between every DUT package, its socket, and the local heater underneath, result in accurate, stable, and fast temperature control of the DUTs.

Figure 3:
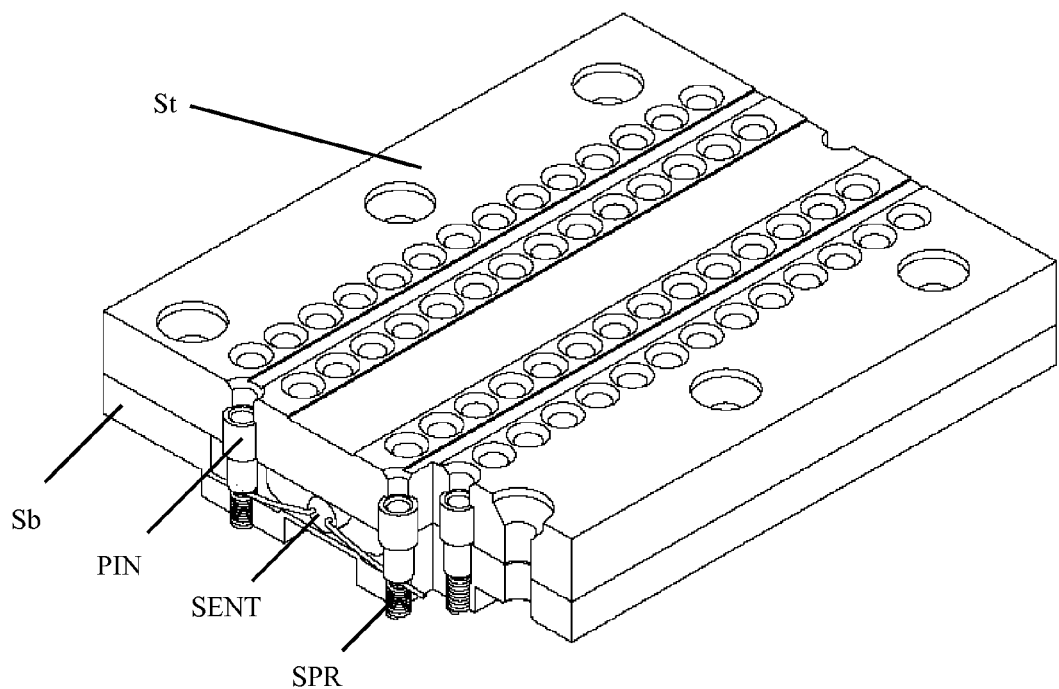
FIG. 3 is a top perspective view of a DUT socket.
Figure 4:
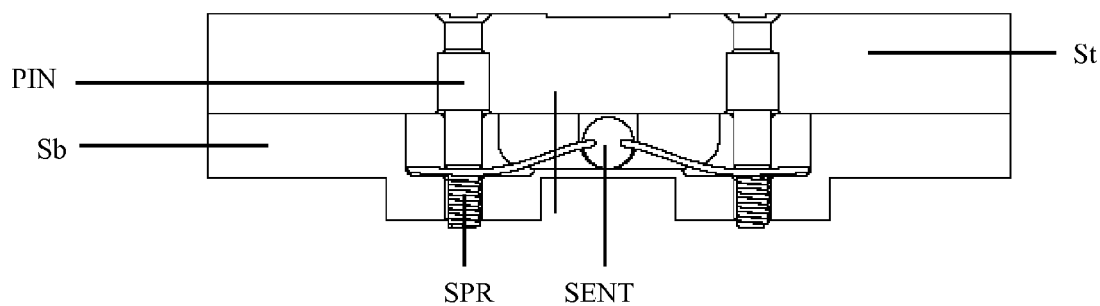
FIG. 4 is a cross-sectional view of the FIG. 3 DUT socket.
Figure 5:
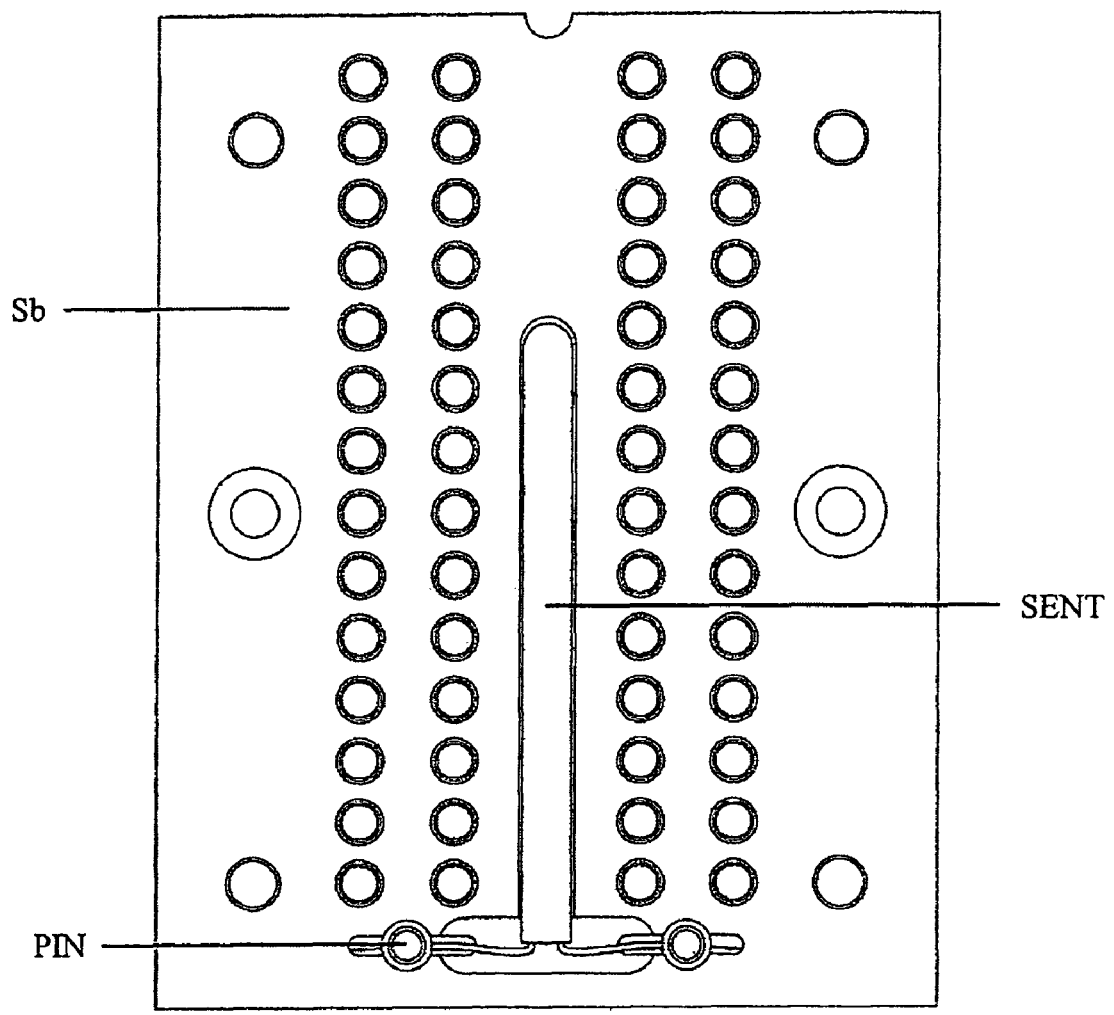
FIG. 5 is a top view of a socket bottom plate, with temperature sensor.

FIGS. 3, 4, and 5 are used to illustrate the thermal action around the DUT in more detail. Note that the specific socket (as disclosed in U.S. Pat. No. 6,798,228) and DUT package shown in this application represent one example, and generally any high temperature socket with an integrated temperature sensor in tight thermal contact with a local heating element may be used; suitable DUT board and heater boards can be made to accommodate it.

The DUT socket in the illustrated example is made of two plates: Sb—the bottom plate, and St—the top plate. The temperature sensor SENT is inserted into a groove in the bottom plate, and its leads are connected by the conductive springs (SPR) and the receptacles (PIN). Similarly, the terminals of the packaged DUT are inserted into the holes in the top plate and the receptacles, and contact the underlying pads (SPAD) on the DUT board DUTB. The details associated with the spring action, the mechanical attachment of the receptacles, and the advantages of this contacting scheme are known (see, e.g., U.S. Pat. No. 6,798,228), and will not be discussed here further.

Figure 6:
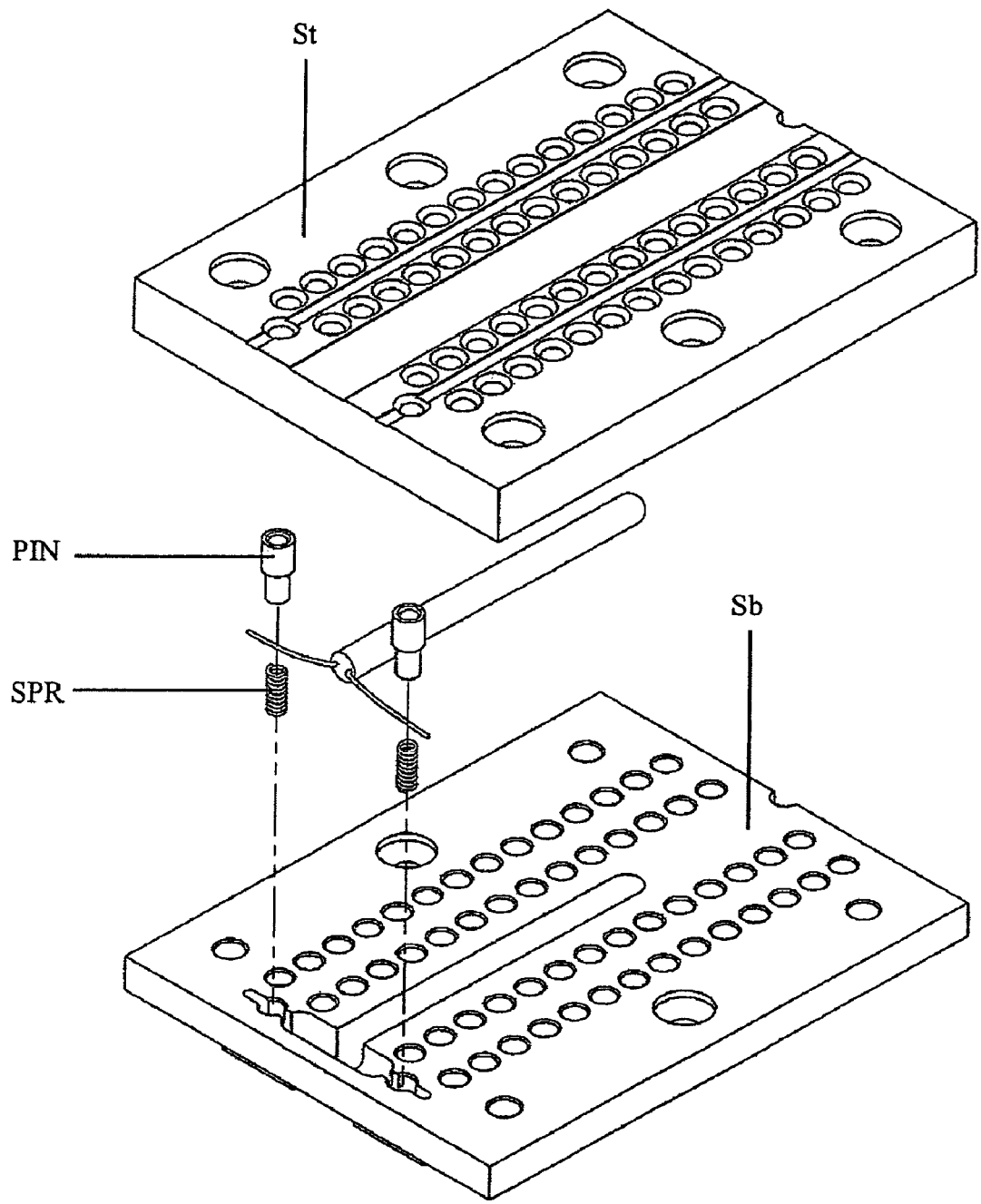
FIG. 6 is an exploded view of the DUT socket and its temperature sensor.

The bottom socket plate Sb is shaped such that the area of the receptacle pins is bulging out, fitting the cut-outs CUTO in the Heater board THB (or BHB). The center part of Sb, with the temperature sensor, practically touches the related local heater of the Heater board. In all, the socket, its local heating element, its temperature sensor, the DUT package, and the DUT board form a well coupled, tight assembly with efficient thermal, electrical, and mechanical features, as particularly illustrated by FIG. 6.

When a typical high temperature test begins, the temperatures of all the individual sensors are read by a dedicated, micro-controller based unit. In most cases these temperatures are much lower than the intended test temperature, so all heaters are turned on. The control unit reads the temperatures continuously, and turns the various heaters off and on dynamically, based on a temperature control algorithm, usually referred to as "PID" (Proportional-Integral-Derivative). The unique combination of "global" heaters, as well as per-socket ("local") ones, provides accurate, responsive, and energy efficient temperature control to each and every tested package.

It can thus be seen that, with the use of both global and local electrical heaters, excellent temperature control may be provided to each DUT, regardless of spatial non-uniformities and differences in joule heating from one DUT to another.

Furthermore, the design may be implemented to provide for connectivity personalization. In general, a DUT is bonded to its package in a way that is unique to that DUT. For example, in one typical 20-pin package, pin 1 may connected for current force (+), pin 5 may connected for current sink (−), and pins 11 and 17 may be related sense pins. However, a different 20-pin DUT may have its same pins configured in a different way for connection to the same signals. In some examples, pegs or jumpers may be provided for reconfiguring how the pins are connected to the tester signals, such that the same hardware (e.g., the sockets) may be used for a large variety of hardware configurations.

What is claimed is:

1. A thermally-controllable integrated unit configured to hold at least one device under test (DUT), comprising:
   at least one heater board, comprised of a thermally-conductive material and provided with at least one global heater printed on the at least one heater board, the at least one global heater being configured to globally heat a DUT board; and
   the DUT board in thermal contact with the at least one heater board, the DUT board including a plurality of sockets, each socket configured to hold at least one DUT, and the DUT board having conductor paths to conduct electrical signals between test equipment and the terminals of DUTs in the sockets, each socket including an associated temperature sensor and a separately controllable local heater configured to, based on a temperature indication from the temperature sensor, activate the local heater for that socket to heat the at least one DUT in that socket, wherein the local heater is a printed heating element.

2. The unit of claim 1, wherein:
   the temperature sensor associated with each DUT socket is located in a groove associated with that DUT socket and each lead of the temperature sensor is coupled to an electrical path on the at least one heater board via a spring, wherein the lead is forced against the spring by a pin.

3. The unit of claim 1, wherein:
   at least some of the global heaters and local heaters are each coupled to an electrical path on the at least one heater board, wherein the electrical path is a path to an external connector via which the heater activation and deactivation may be controlled.

4. The unit of claim 1, wherein:
   at least some of the global heaters and local heaters are each coupled to an electrical path on the at least one heater board, wherein the electrical path is a path to a pin contact having a spring loaded peg inserted therein, the pin contact providing an external connection via which the heater activation and deactivation may be controlled.

5. The unit of claim 1, wherein:
   the conductor paths to conduct electrical signals between test equipment and the terminals of DUTs in the sockets are reconfigurable.

6. The unit of claim 5, wherein the conductor paths being reconfigurable includes pegs or jumpers being provided for reconfiguring how the pins of the DUTs in the sockets are connected to the tester signals.

7. A thermally-controllable integrated unit configured to hold at least one device under test (DUT), comprising:
   two heater boards, comprised of a thermally-conductive material and provided with at least one global heater configured to globally heat a DUT board is sandwiched between the two heater boards; and
   the DUT board in thermal contact with the two heater boards, the DUT board including a plurality of sockets, each socket configured to hold at least one DUT, and the DUT board having conductor paths to conduct electrical signals between test equipment and the terminals of DUTs in the sockets, each socket including an associated temperature sensor and a separately controllable local heater configured to, based on a temperature indication from the temperature sensor, activate a local heater for that socket to heat the at least one DUT in that socket.

8. The unit of claim 7, further comprising a buffer board comprised of an electrically insulating, yet thermally conductive, material, and located between one of the heater boards and the DUT board, the buffer board providing mechanical support to the DUT board to avoid excessive mechanical stress on printed layer of the DUT board.

9. The unit of claim 7, wherein the temperature sensor associated with each DUT socket is located in a groove associated with that DUT socket and each lead of the temperature sensor is coupled to an electrical path on the at least one heater board via a spring, wherein the lead is forced against the spring by a pin.

10. The unit of claim 7, wherein at least some of the global heaters and local heaters are each coupled to an electrical path on the at least one heater board, wherein the electrical path is a path to an external connector via which the heater activation and deactivation may be controlled.

11. The unit of claim 7, wherein at least some of the global heaters and local heaters are each coupled to an electrical path on the at least one heater board, wherein the electrical path is a path to a pin contact having a spring loaded peg inserted therein, the pin contact providing an external connection via which the heater activation and deactivation may be controlled.

12. The unit of claim 7, wherein the conductor paths to conduct electrical signals between test equipment and the terminals of DUTs in the sockets are reconfigurable.

13. A thermally-controllable integrated unit configured to hold at least one device under test (DUT), comprising:
    at least one heater board, comprised of a thermally-conductive material and provided with at least one global heater configured to globally heat a DUT board; and
    the DUT board in thermal contact with the at least one heater board, the DUT board including a plurality of sockets, each socket configured to hold at least one DUT, and the DUT board having conductor paths to conduct electrical signals between test equipment and the terminals of DUTs in the sockets, each socket including an associated temperature sensor and a separately controllable local heater configured to, based on a temperature indication from the temperature sensor, activate the local heater for that socket to heat the at least one DUT in that socket; and
    a buffer board comprised of an electrically insulating, yet thermally conductive, material, and located between the at least one heater board and the DUT board, the buffer board providing mechanical support to the DUT board to avoid excessive mechanical stress on printed layer of the DUT board.

14. The unit of claim 13, wherein the conductor paths to conduct electrical signals between test equipment and the terminals of DUTs in the sockets are reconfigurable.

15. The unit of claim 14, wherein the conductor paths being reconfigurable includes pegs or jumpers being provided for reconfiguring how the pins of the DUTs in the sockets are connected to the tester signals.

16. The unit of claim 13, wherein the temperature sensor associated with each DUT socket is located in a groove associated with that DUT socket and each lead of the temperature sensor is coupled to an electrical path on the at least one heater board via a spring, wherein the lead is forced against the spring by a pin.

17. The unit of claim 13, wherein at least some of the global heaters and local heaters are each coupled to an electrical path on the at least one heater board, wherein the electrical path is a path to an external connector via which the heater activation and deactivation may be controlled.

18. The unit of claim 13, wherein at least some of the global heaters and local heaters are each coupled to an electrical path on the at least one heater board, wherein the electrical path is a path to a pin contact having a spring loaded peg inserted therein, the pin contact providing an external connection via which the heater activation and deactivation may be controlled.

19. A method of controlling heaters of an integrated unit configured to hold at least one device under test (DUT), the integrated unit comprising at least one heater board, comprised of a thermally-conductive material and provided with at least one global heater configured to globally heat a DUT board; and the DUT board in thermal contact with the at least one heater board, the DUT board including a plurality of sockets, each socket configured to hold one of the at least one DUT, and the DUT board having conductor paths to conduct electrical signals between test equipment and the terminals of DUTs in the sockets, each socket including an associated temperature sensor and a separately controllable local heater configured to, based on a temperature indication from the temperature sensor, activate the local heater for that socket to locally heat a DUT in that socket wherein the local heater is a printed heating element, the method comprising:
    controlling the at least one global heater to globally heat the DUT board, wherein the at least one global heater is printed on the at least one heater board; and
    receiving signals from the temperature sensors and, based thereon, selectively activating the local heaters to maintain a desired temperature at each socket.

20. A method of controlling heaters of an integrated unit configured to hold at least one device under test (DUT), the integrated unit comprising at least one heater board, comprised of a thermally-conductive material and provided with at least one global heater configured to globally heat the DUT board; and a DUT board in thermal contact with the at least one heater board, the DUT board including a plurality of sockets, each socket configured to hold one of the at least one DUT, and the DUT board having conductor paths to conduct electrical signals between test equipment and the terminals of DUTs in the sockets, each socket including an associated temperature sensor and a separately controllable local heater configured to, based on a temperature indication from the temperature sensor, activate a local heater for that socket to locally heat a DUT in that socket, the method comprising:
    controlling the at least one global heater to globally heat the DUT board; and receiving signals from the temperature sensors and, based thereon, selectively activating the local heaters to maintain a desired temperature at each socket, wherein:
    selectively activating the local heaters includes processing the received temperature sensor signals according to a Proportional-Integral-Derivative algorithm.

* * * * *